(12) United States Patent
Nozu et al.

(10) Patent No.: US 11,164,803 B2
(45) Date of Patent: Nov. 2, 2021

(54) UNIT WITH WIRING BOARD, MODULE, AND EQUIPMENT

(71) Applicant: CANON KABUSHIKI KAISHA, Tokyo (JP)

(72) Inventors: Satoshi Nozu, Ebina (JP); Yu Aoki, Ayase (JP); Hirotaka Sekiguchi, Tokyo (JP); Koji Sato, Ebina (JP); Koji Tsuduki, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 16/540,735

(22) Filed: Aug. 14, 2019

(65) Prior Publication Data

US 2020/0075437 A1 Mar. 5, 2020

(30) Foreign Application Priority Data

Aug. 30, 2018 (JP) .............................. JP2018-161962

(51) Int. Cl.
| | | |
|---|---|---|
| H01L 23/053 | (2006.01) | |
| H01L 25/065 | (2006.01) | |
| H01L 23/538 | (2006.01) | |
| H01L 23/00 | (2006.01) | |
| H01L 31/0203 | (2014.01) | |
| H01L 33/48 | (2010.01) | |
| H01L 23/15 | (2006.01) | |

(52) U.S. Cl.
CPC ............ *H01L 23/053* (2013.01); *H01L 23/15* (2013.01); *H01L 23/5383* (2013.01); *H01L 24/48* (2013.01); *H01L 25/0657* (2013.01); *H01L 31/0203* (2013.01); *H01L 33/483* (2013.01); *H01L 2224/48227* (2013.01)

(58) Field of Classification Search
CPC .............. H01L 23/053; H01L 25/0657; H01L 23/5383; H01L 24/48; H01L 31/0203; H01L 33/483; H01L 23/15
See application file for complete search history.

(56) References Cited

U.S. PATENT DOCUMENTS

| | | | |
|---|---|---|---|
| 2004/0212717 | A1 | 10/2004 | Minamio |
| 2005/0074912 | A1 | 4/2005 | Yamauchi |
| 2005/0109926 | A1 | 5/2005 | Minamio |
| 2017/0062663 | A1* | 3/2017 | Hayashi .................. H01L 33/62 |
| 2018/0175267 | A1* | 6/2018 | Hirasawa ................ H01L 33/62 |

FOREIGN PATENT DOCUMENTS

| | | |
|---|---|---|
| JP | 6-350068 A | 12/1994 |
| JP | 2003-110945 A | 4/2003 |
| JP | 2007-19275 A | 1/2007 |
| JP | 2008-130738 A | 6/2008 |
| JP | 2014-212168 A | 11/2014 |
| JP | 2015-185763 A | 10/2015 |
| JP | 2017-120848 A | 7/2017 |

\* cited by examiner

*Primary Examiner* — Matthew L Reames
(74) *Attorney, Agent, or Firm* — Canon U.S.A., Inc. IP Division

(57) ABSTRACT

A unit includes a wiring board having a first face having a mounting portion on which an electronic device is mounted, a second face opposite to the first face, and end faces continuous with the first face and the second face, a resin member provided to cover the end faces and to have protrusions protruding upward from the end faces to face each other across a space above the mounting portion, and an insulating film covering the second face, wherein at least a part of an edge of the insulating film is provided away from an end of the second face on the end face side.

20 Claims, 7 Drawing Sheets

UNIT WITH WIRING BOARD, MODULE, AND EQUIPMENT

BACKGROUND OF THE INVENTION

Field of the Invention

The present disclosure relates to a unit including a wiring board.

Description of the Related Art

As a mounting unit on which an electronic device is to be mounted, there is a unit including a wiring board and a resin member. Japanese Patent Application Laid-Open No. 2015-185763 discusses a hollow package on which a semiconductor element is to be mounted. The hollow package includes a circuit board, and a resin frame surrounding a mounting surface of the circuit board and covering an outer peripheral end face of the circuit board. Japanese Patent Application Laid-Open No. 2017-120848 discusses an imaging unit including a substrate on which an image pickup element and an electronic component are disposed, and a frame that surrounds the image pickup element and includes a resin portion.

As for the techniques disclosed in Japanese Patent Application Laid-Open No. 2015-185763 and Japanese Patent Application Laid-Open No. 2017-120848, quality and yield have not been sufficiently discussed. In Japanese Patent Application Laid-Open No. 2015-185763, for example, if the circuit board has a foreign substance or burr, the foreign substance or burr can adversely affect formation of the resin frame and mounting on a substrate, and thus can lead to decline in quality and yield.

SUMMARY OF THE INVENTION

The present technique is directed to improving quality and yield in a unit with a wiring board. According to an aspect of the present disclosure, a unit includes a wiring board having a first face having a mounting portion on which an electronic device is mounted, a second face opposite to the first face, and end faces continuous with the first face and the second face, a resin member provided to cover the end faces and to have portions between which a space above the mounting portion is located, and an insulating film covering the second face, wherein at least a part of an edge of the insulating film is provided away from an end of the second face on the end face side.

According to another aspect of the present disclosure, a unit includes a wiring board having a first face having a mounting portion on which an electronic device is mounted, a second face opposite to the first face, and end faces continuous with the first face and the second face, a resin member provided to cover the end faces and to have portions between which a space above the mounting portion is located, and at least one electronic component disposed on the second face and fixed to the wiring board, wherein the resin member does not overlap the one electronic component.

Further features of the present disclosure will become apparent from the following description of exemplary embodiments with reference to the attached drawings.

DESCRIPTION OF THE EMBODIMENTS

Figure 1A:
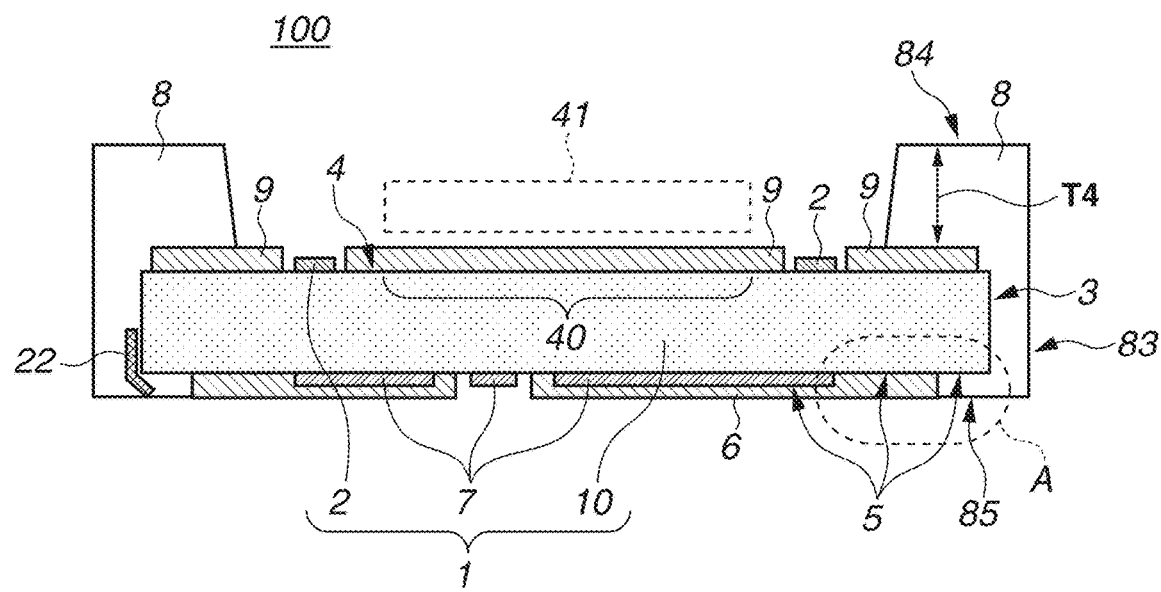
FIGS. 1A and 1B are diagrams illustrating a mounting unit.

Exemplary embodiments of the present disclosure will be described below with reference to the drawings. In the present disclosure, a technique that is advantageous to improve quality and yield in a unit with a wiring board is provided.

In the descriptions below and the drawings, a configuration common to a plurality of drawings is provided with a common reference numeral. Thus, the common configuration will be described with reference to the plurality of drawings, and the description of the configuration provided with the common reference numeral may be omitted as appropriate.

Figure 1B:
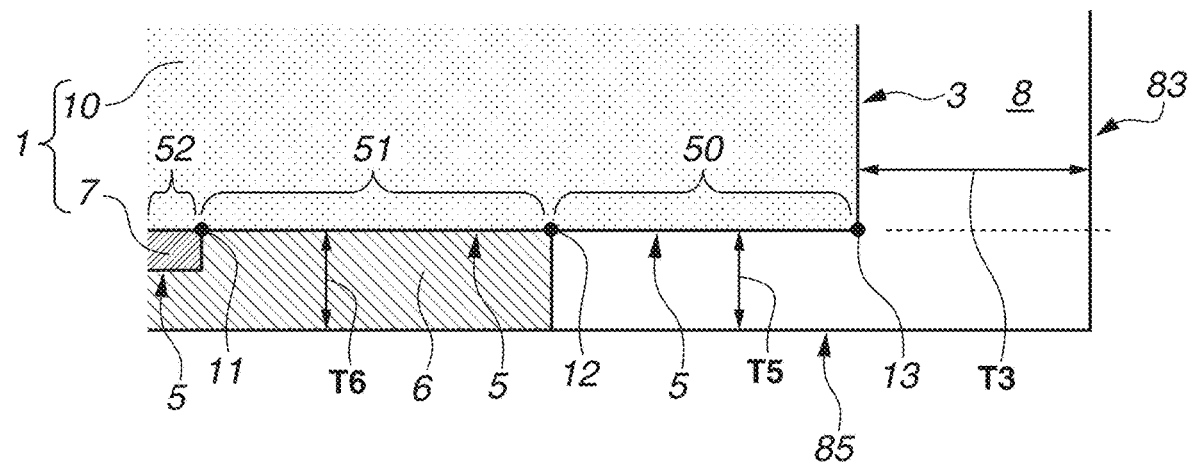

FIG. 1A is a cross-sectional diagram schematically illustrating a mounting unit 100 according to a first exemplary embodiment. FIG. 1B is a cross-sectional diagram illustrating a portion A in FIG. 1A in an enlarged manner.

The mounting unit 100 includes a wiring board 1, a resin member 8, and an insulating film 6. The wiring board 1 has a surface 4, an undersurface 5 opposite to the surface 4, and end faces 3 continuous with the surface 4 and the undersurface 5. The surface 4 can be called a front surface, and the undersurface 5 can be called a back surface. The surface 4 includes a mounting portion 40 on which an electronic device (not illustrated) is mounted. The mounting portion 40 is located approximately at the center of the surface 4. The wiring board 1 includes a substrate 10 having insulating properties, and conductive layers 7 provided on the substrate 10 on the undersurface 5 side. The wiring board 1 has a thickness of about 0.05 mm to 2 mm. The substrate 10 may be a laminated member including a plurality of insulating layers.

The substrate 10 and the conductive layers 7 constitute the undersurface 5. The conductive layers 7 are present on an undersurface of the substrate 10 on the undersurface 5 side of the wiring board 1. The insulating film 6 covers the undersurface 5. The insulating film 6 can cover the conductive layers 7, and the conductive layers 7 are located between the insulating film 6 and the substrate 10. The insulating film 6 can be in contact with the substrate 10 and the conductive layers 7. The insulating film 6 has a thickness of about 5 μm to 100 μm.

The wiring board 1 can further include conductive layers 2 provided on the substrate 10 on the surface 4 side. The conductive layers 2 and the substrate 10 constitute the surface 4. The mounting unit 100 can further include an insulating film 9. The insulating film 9 covers the surface 4. The insulating film 9 on the surface 4 side has a thickness of about 5 μm to 100 μm. The insulating film 9 can cover a part of the conductive layers 2, and the conductive layers 2 are located between the insulating film 9 and the substrate 10. The insulating film 9 can be in contact with the substrate 10 and the conductive layers 2. The conductive layers 7 and the conductive layers 2 may be electrically connected by wiring provided inside the substrate 10. In the figures, the conductive layers 2 and the conductive layers 7 are illustrated only on the surface 4 and the undersurface 5. However, in a case where the wiring board 1 is a multi-layer wiring board or a build-up wiring board, a conductive layer is also present inside the substrate 10. Each of the conductive layers 2 and 7 has been subjected to patterning to have a desired shape as necessary, and the plurality of the conductive layers are connected by, for example, a via as necessary.

The conductive layers 2 on the surface 4 side include a connecting electrode to be connected with an electronic device to be described below by wire bonding, and an electroplating line for electroplating the electrode with a substance such as gold or nickel. The conductive layers 7 on the undersurface 5 side include, for example, an external output terminal, an electroplating line similar to the one described above, and an electrode for connection to an electronic component to be described below. Among the conductive layers 7, a conductive layer located near the end faces 3 of the wiring board 1 is the electroplating line in many cases.

The resin member 8 is provided to cover the end faces 3 and to have portions between which a space 41 above the mounting portion 40 is located. Typically, the resin member 8 is provided to surround the space 41. The resin member 8 provided to have portions between which the space 41 is located means that the resin member 8 is located on both sides of the space 41. The resin member 8 surrounding the space 41 means that the resin member 8 is located on all sides of the space 41. Of the resin member 8, a portion provided to have protrusions protruding upward from the end faces to face each other across the space 41 above the mounting portion 40 covers the surface 4. A thickness T4 of the resin member 8 on the surface 4 can be greater than a thickness T3 of the resin member 8 on the end face 3 (T4>T3).

An outer surface of the resin member 8 includes an inside surface facing the space 41, an outside surface 83 along the end face 3, an upper surface 84 along the surface 4, and a lower surface 85 along the undersurface 5. The thickness T3 is the distance from the end face 3 to the outside surface 83, the thickness T4 is the distance from the surface 4 to the upper surface 84, and a thickness T5 is the distance from the undersurface 5 to the lower surface 85. Of the resin member 8, a portion covering the surface 4 and including the upper surface 84 can be referred to as an upper portion, a portion covering the undersurface 5 and including the lower surface 85 can be referred to as a lower portion, and a portion covering the end face 3 and including the outside surface 83 can be referred to as a side portion.

The substrate 10 for which the present exemplary embodiment is suitable is, for example, a glass epoxy substrate made of a glass epoxy material. Each of the insulating film 6 and the insulating film 9 for which the present exemplary embodiment is suitable is a solder resist film including a solder resist material. Typically, each of the conductive layers 7 and the conductive layers 2 is a copper layer. The resin member 8 for which the present exemplary embodiment is suitable is a molded member.

At least a part of an edge 12 of the insulating film 6 is provided away from an end 13 of the undersurface 5 on the end face 3 side. The end 13 constitutes a boundary between the end face 3 and the undersurface 5. Providing the edge 12 away from the end 13 can prevent a foreign substance that is attributable to the insulating film 6 or the wiring board 1 from adhering to a portion near the edge 12.

An offset region 50 of the undersurface 5 is formed by providing the edge 12 away from the end 13. The offset region 50 of the undersurface 5 is located between a part of the edge 12 of the insulating film 6 and the end 13. Because the insulating film 6 is provided away from the end 13, a recessed portion can be formed between the undersurface 5 (offset region 50) of the wiring board 1 and a side edge of the insulating film 6. Because the recessed portion is provided, a foreign substance can be contained in the recessed portion so that an influence of the foreign substance can be reduced. In this aspect, a depth of the recessed portion is equivalent to a thickness T6 of the insulating film 6. When the size of the foreign substance is taken into consideration, the thickness T6 of the insulating film 6 is desirably 20 μm to 100 μm. Covering the offset region 50 with the resin member 8 can reduce an undesirable influence of the foreign substance attributable to the insulating film 6 or the wiring board 1. A difference |T5−T6| between the thickness T5 of the resin member 8 on the offset region 50 and the thickness T6 of the insulating film 6 is smaller than the thickness T6 of the insulating film 6 (|T5−T6|<T6). In this example, the thickness T5 is equal to the thickness T6 (T5=T6).

As illustrated in FIG. 1B, the conductive layer 7 is covered with the insulating film 6, but the conductive layer 7 may also have a portion not covered with the insulating film 6. In a region where the insulating film 6 is present, the conductive layer 7 is present between the undersurface 5 and the insulating film 6.

The insulating film 6 has a non-overlap region 51, which does not overlap the conductive layer 7, and an overlap region 52, which overlaps the conductive layer 7. A border between the non-overlap region 51 and the overlap region 52 is determined by an edge 11 of the conductive layer 7. The insulating film 6 covers the edge 11. The thickness T6 described above is a thickness of the insulating film 6 in the non-overlap region 51. The thickness T5 may be greater than a thickness of the insulating film 6 in the overlap region 52.

A solid body 22 in a fibrous form and made of the same material as that of the wiring board 1 may be embedded in the resin member 8. The solid body 22 can be produced when the wiring board 1 is processed. By embedding the solid body 22 in the resin member 8 and fixing the embedded solid body 22, it is possible to prevent an undesirable influence of the solid body 22 on the operation of a module to be described below. A solid body in fibrous form and made of the same material as that of the insulating film 6 or the insulating film 9 may also be embedded in the resin member 8.

Figure 4A:
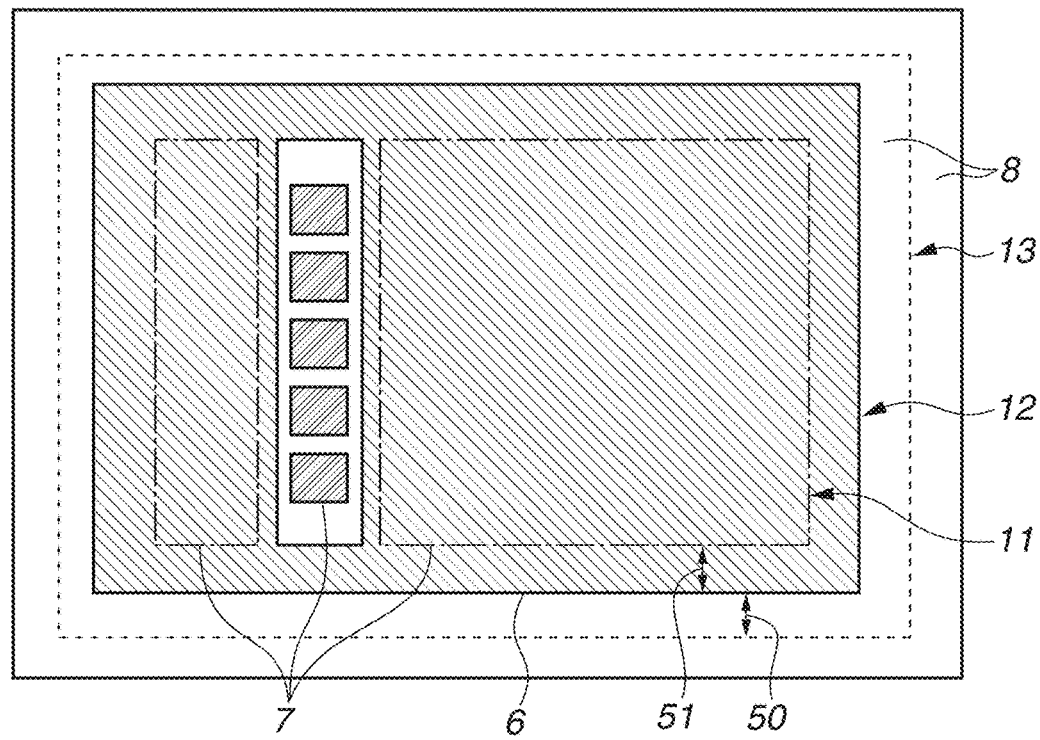
FIGS. 4A and 4B are diagrams illustrating a mounting unit.

FIG. 4A is a plan view schematically illustrating the mounting unit 100 viewed from the undersurface 5 side. In this example, the edge 12 of the insulating film 6 is located inside of the end 13 of the wiring board 1 along the entire circumference. It is desirable to provide the offset region 50 and the non-overlap region 51 near the end 13 of the wiring board 1 continuously along the entire circumference. This can stably prevent biting of a foreign substance as will be described below. Further, the offset region 50 (region between the edge 12 of the insulating film 6 and a dot-and-dash line) is provided at a fixed distance from the edge 12 of the insulating film 6.

Providing the insulating film 6 away from the end 13 of the wiring board 1 can be formed by a known method such as a method of patterning the insulating film 6 using a printing plate. The end 13 of the wiring board 1 is formed by subjecting the wiring board 1 to machining such as dicing and routing. Since the insulating film 6 is provided away from the end 13, the insulating film 6 is not processed at the time of the machining. Thus, dust generation from the insulating film 6 can be avoided.

The offset region 50 is formed between the edge 12 and the end 13, and (the lower portion of) the resin member 8 overlaps the offset region 50. Some of the conductive layers 7 (i.e., an electrode having a pattern with five quadrangles) are exposed from an opening of the insulating film 6, and the remainder of the conductive layers 7 are covered with the insulating film 6. An external terminal is to be connected to the exposed electrode of the conductive layer 7. The insulating film 6 has the non-overlap region 51 between the edge 12 thereof and the edge 11 of the conductive layer 7. A width (length in a direction from the edge 12 toward the end 13) of the offset region 50 may be smaller than the width of the non-overlap region 51, but is desirably greater than the width of the non-overlap region 51. This is because damage to the conductive layer 7 can be reduced and the yield and reliability can be improved since the conductive layer 7 can be provided further away from the end face 3.

The end face 3 is formed mainly of the substrate 10 having insulating properties. Desirably, the conductive layers 2 and 7 are not part of the end face 3. In other words, it is desirable that the edge 11 of the conductive layer 7 be also provided away from the end 13 of the wiring board 1. If the conductive layer 7 extends to the end 13 of the wiring board 1, the conductive layer 7 is cut at the time of processing the end face 3 of the wiring board 1 and becomes a source of a foreign substance from the end face 3 of the wiring board 1. Since the edge 11 is provided away from the end 13, it is possible to prevent the conductive layer 7 from becoming the source of a foreign substance. Desirably, the resin member 8 does not overlap the conductive layer 7. Between the lower surface 85 of the resin member 8 and the undersurface 5 of the substrate 10, the offset region 50, the non-overlap region 51, and the overlap region 52 are not mixed (only the offset region 50 is present) and therefore, the flatness of the lower surface 85 can be improved.

Figure 2A:
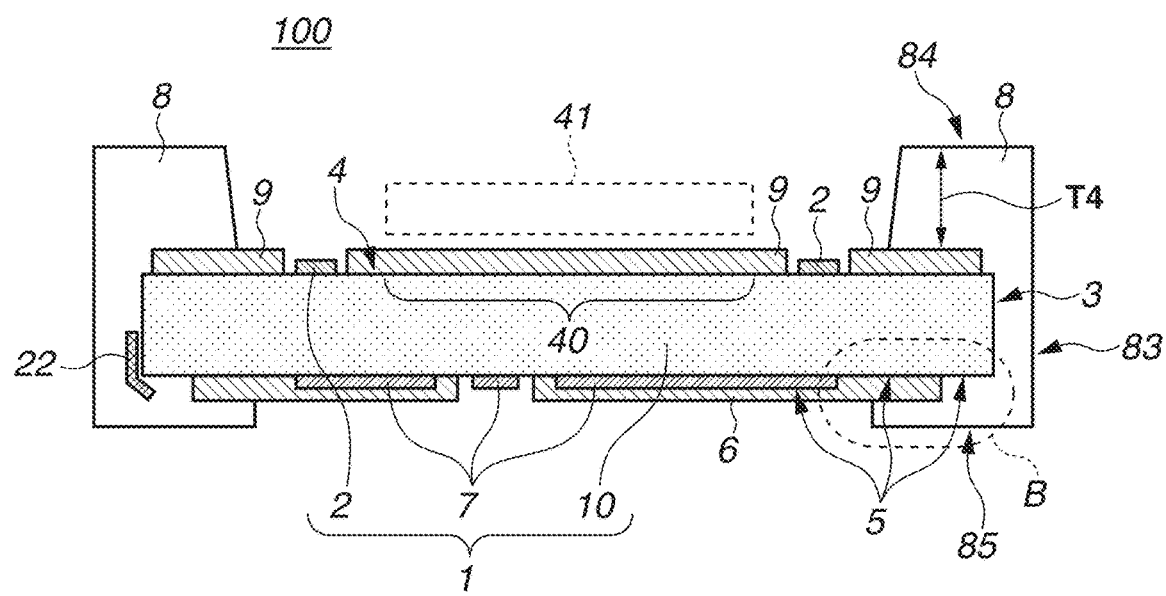
FIGS. 2A and 2B are diagrams illustrating a mounting unit.
Figure 2B:
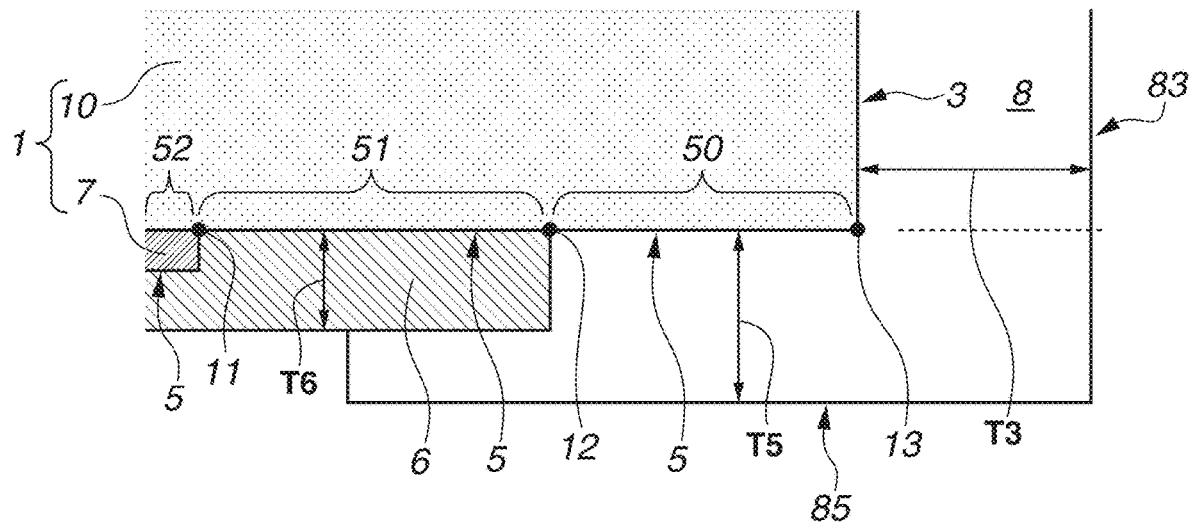

FIG. 2A is a cross-sectional diagram schematically illustrating a mounting unit 100 according to a second exemplary embodiment. FIG. 2B is a cross-sectional diagram illustrating a portion B in FIG. 2A in an enlarged manner.

In the second exemplary embodiment, a shape of a resin member 8 on an undersurface 5 is different from that in the first exemplary embodiment. In the second exemplary embodiment, a point that can be the same as that of the first exemplary embodiment will not be described.

In the second exemplary embodiment, a portion of an insulating film 6 is located between the resin member 8 and the undersurface 5. An edge 12 of the insulating film 6 is covered with the resin member 8.

In the second exemplary embodiment, a thickness T5 of the resin member 8 in an offset region 50 is greater than a thickness T6 of the insulating film 6 (T5>T6). On the other hand, in the second exemplary embodiment, as with the first exemplary embodiment, a difference |T5−T6| between the thickness T5 of the resin member 8 in the offset region 50 and the thickness T6 of the insulating film 6 is smaller than the thickness T6 of the insulating film 6 (|T5−T6|<T6). In the second exemplary embodiment, the resin member 8 on the undersurface 5 has a lower surface 85 that is parallel to the undersurface 5. Between the lower surface 85 and the undersurface 5, the thickness of the resin member 8 varies depending on the presence or absence of the insulating film 6. In this example, the thickness of a portion of the resin member 8 overlapping the insulating film 6 is equivalent to T5−T6. However, it may also be such that T5>T6 and |T5−T6|=T6 are established. The resin member 8 has a structure in which an amount of resin near an end 13 of a wiring board 1 and the edge 12 of the insulating film 6 is larger than that in the first exemplary embodiment. Thus, a larger solid body 22 can be embedded in the resin member 8. In addition, since T6 is smaller than T5 in the present exemplary embodiment, the insulating film 6 and a conductive layer 7 on the undersurface 5 side can be provided away from a placement surface of the mounting unit 100. Thus, it is possible to prevent the insulating film 6 and the conductive layer 7 from being rubbed and scratched when handling the mounting unit 100.

Desirably, the resin member 8 does not overlap the conductive layer 7. Between the lower surface 85 of the resin member 8 and the undersurface 5 of the substrate 10, the offset region 50, a non-overlap region 51, and an overlap region 52 are not mixed (only the offset region 50 and the non-overlap region 51 are present). Thus, the flatness of the lower surface 85 can be improved.

Further, it is desirable that the lower surface 85 be at a fixed distance from the undersurface 5 and be parallel with the undersurface 5. As a result, an upper surface 84 and the lower surface 85 become parallel, whereby a module having a stable shape can be provided. Furthermore, in a case where a semiconductor apparatus mounted with an electronic device is to be produced using the module according to the present exemplary embodiment, the lower surface 85 is also parallel with the electronic device. Thus, the lower surface 85 can be used as a positional reference of the electronic device.

Figure 3A:
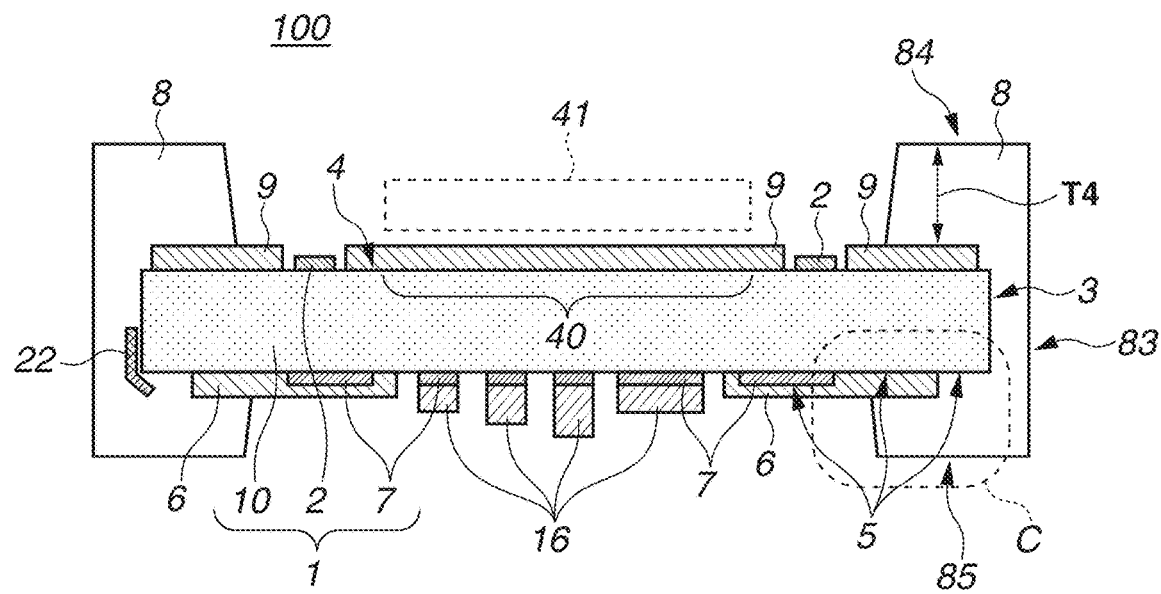
FIGS. 3A and 3B are diagrams illustrating a mounting unit.
Figure 3B:
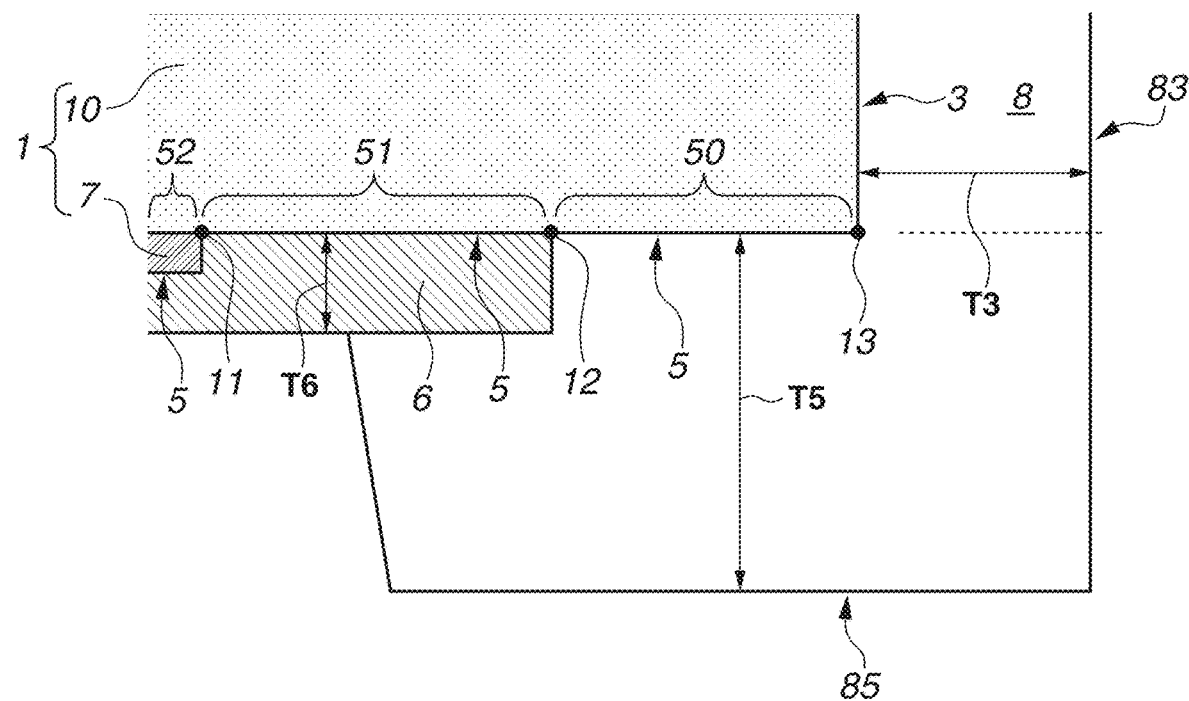

FIG. 3A is a cross-sectional diagram schematically illustrating a mounting unit 100 according to a third exemplary embodiment. FIG. 3B is a cross-sectional diagram illustrating a portion C in FIG. 3A in an enlarged manner.

In the third exemplary embodiment, a shape of a resin member 8 on an undersurface 5 is different from that in the second exemplary embodiment. In the third exemplary embodiment, a point that can be the same as that of the first or second exemplary embodiment will not be described.

In the third exemplary embodiment, a portion of an insulating film 6 is located between the resin member 8 and the undersurface 5. An edge 12 of the insulating film 6 is covered with the resin member 8.

In the third exemplary embodiment, a thickness T5 of the resin member 8 in an offset region 50 is greater than a thickness T6 of the insulating film 6 (T5>T6), as with the second exemplary embodiment. Further, a difference |T5−T6| between the thickness T5 of the resin member 8 in the offset region 50 and the thickness T6 of the insulating film 6 is greater than the thickness T6 of the insulating film 6 (|T5−T6|>T6). In the third exemplary embodiment as well, the resin member 8 on the undersurface 5 has a lower surface 85 that is parallel to the undersurface 5. Between the lower surface 85 and the undersurface 5, the thickness of the resin member 8 varies depending on the presence or absence of the insulating film 6. In this example, the thickness of a portion of the resin member 8 overlapping the insulating film 6 is equivalent to T5−T6.

Figure 4B:
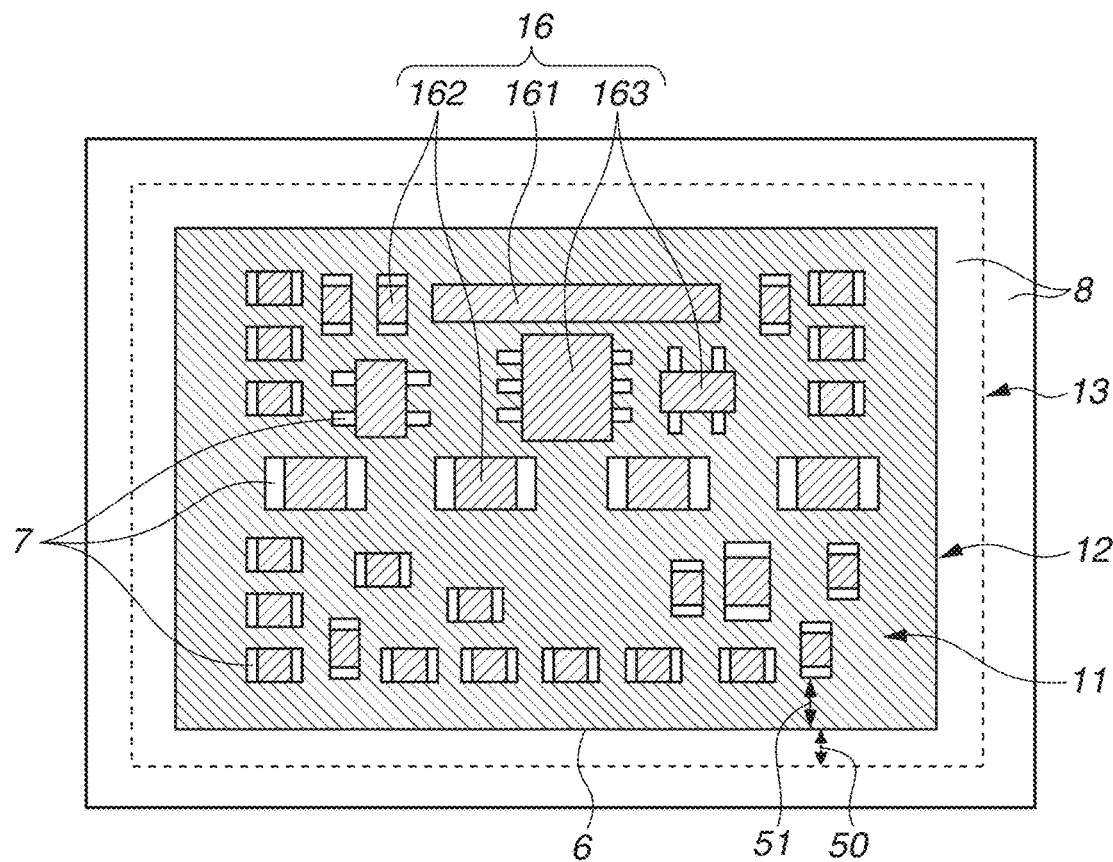

The third exemplary embodiment is different from the first and second exemplary embodiments also in that a plurality of electronic components 16 is arranged side by side along and on the undersurface 5. As illustrated in FIG. 4B, the plurality of electronic components 16 can include a mechanism component 161 such as a connector, a passive component 162 having two terminals such as a chip resistor or a chip capacitor, and an active component 163 such as a diode, a transistor, a simple integrated circuit (IC), or a read only memory (ROM). The passive component 162 can be a ceramic capacitor, an organic polymer capacitor, or a tantalum capacitor. The plurality of electronic components 16 can also include a passive component or an active component other than the components described above.

The plurality of electronic components 16 is arranged on the undersurface 5 side of a wiring board 1. Some of the conductive layers 7 of the wiring board 1 are electrodes for the electronic components 16, and the electronic components 16 are soldered to the respective electrodes. The wiring board 1, on which the electronic components 16 described above are arranged, has the electrodes for the electronic components 16 that are exposed on the undersurface 5 side. Thus, if a foreign substance from an end face 3 of the wiring board 1 moves and adheres to a portion between the electrodes, a fault due to a short circuit between the electrodes can occur. However, in the present exemplary embodiment, the end face 3 of the wiring board 1, which is a foreign substance source, is sealed with resin. Further, a recessed portion that can contain a foreign substance is provided due to the offset region 50. Accordingly, it is possible to reduce a fault of the mounting unit 100 and an electronic module including the mounting unit 100.

When considered in a direction perpendicular to the undersurface 5, the plurality of electronic components 16 is provided not to overlap the resin member 8. Since the plurality of electronic components 16 is provided on the undersurface 5 in this manner, it is possible to use a region on the undersurface 5 effectively while disposing the resin member 8 on the undersurface 5. A size of each of the electronic components 16 can be smaller than an area of the mounting portion 40. Further, the plurality of electronic components 16 can be arranged to overlap the mounting portion 40. On the undersurface 5, an electronic component (not illustrated) not overlapping the mounting portion 40 can also be arranged in addition to the plurality of electronic components 16 overlapping the mounting portion 40. In this example, the thickness T5 is greater than a height of each of the electronic components 16. Furthermore, since the lower surface 85 protrudes so that the thickness T5 is greater than the height of each of the electronic components 16, not only the insulating film 6 and the conductive layer 7 but also the electronic components 16 can be provided away from a placement surface of the mounting unit 100. As a result, it is possible to prevent the electronic components 16 from being damaged during handling thereof and to prevent a mechanical stress from being applied to the electronic components 16. The thickness T5 may also be smaller than the heights of the electronic components 16.

When considered in a direction parallel to the undersurface 5, the resin member 8 is provided away from the plurality of electronic components 16. The resin member 8 is provided to have portions between which the plurality of electronic components 16 is arranged. Typically, the resin member 8 is provided to surround the plurality of electronic components 16. The resin member 8 having portions between which the plurality of electronic components 16 is arranged means that the resin member 8 is located on both sides of the plurality of electronic components 16. The resin member 8 surrounding the plurality of electronic components 16 means that the resin member 8 is located on all sides of the plurality of electronic components 16. On the undersurface 5, an electronic component (not illustrated) provided in contact with the resin member 8 can also be disposed in addition to the plurality of electronic components 16 provided away from the resin member 8.

Herein, the example in which the plurality of electronic components 16 is provided has been described as the third exemplary embodiment. However, the plurality of electronic components 16 can also be arranged in a case where the resin member 8 in each of the first exemplary embodiment and the second exemplary embodiment is provided.

With regard to the first to third exemplary embodiments, characteristics of the mounting unit 100 will be described with reference to FIGS. 5A, 5B, 5C, and 5D. In a case where a glass epoxy substrate is used as the substrate 10 of the wiring board 1, the glass epoxy substrate includes glass fiber, resin, and metal as materials. Thus, a solid body 22 such as a glass fiber foreign substance, a resin foreign substance, or a metal foreign substance that is made of the materials of the wiring board 1 can be produced from the end face 3 of the wiring board 1. The end face 3 is formed by cutting the wiring board 1. If the solid body 22 adheres to an electronic device 20, a defect can easily occur. As described above, the materials of the glass epoxy substrate are the glass fiber, resin, and metal. The wiring board 1 made of these materials is subjected to outer shape machining such as dicing, routing, and mold cutting to have a desired shape. However, because the outer shape machining is merely machining such as cutting and polishing, the end face 3 of the wiring board 1 can become a foreign substance source.

The resin member 8 covers the end face 3 of the wiring board 1 from an end on the surface 4 side to an end on the undersurface 5 side to have a structure that avoids generation of dust from the end face 3 of the wiring board 1. Further, the resin member 8 extends upward on a peripheral portion of the surface 4 to have a frame shape. In a case where the resin member 8 has a frame shape, the mounting unit 100 can be used as a module having a hollow structure. Such a shape can be formed by molding in which the wiring board 1 is clamped between an upper mold 31 and a lower mold 32 for molding and the resin member 8 is injected as a molding resin.

Specific examples of the solid body 22 include a scrap of glass fiber, a scrap of resin, and a scrap of metal formed during cutting processing, and the scraps may be regarded as foreign substances. The examples further include a foreign substance, such as glass fiber, resin, and metal pieces, hanging from the end face 3 of the wiring board 1 without being detached therefrom. The examples further include glass fiber, resin, or metal burr formed during the processing. It is difficult to remove and eradicate such a foreign substance. This is because, even if an attempt is made to remove the foreign substance by cleaning, normal glass fiber within the substrate may be newly cut off or resin within the substrate may be destroyed by a stress applied during the process of the cleaning, so that a new foreign substance is formed.

Thus, in a case where the resin member 8 is to be molded at the end face 3 of the wiring board 1, if a foreign substance or burr hangs from the end face 3 of the wiring board 1, the foreign substance or burr is caught between the wiring board 1 and the mold for molding. This raises such an issue that a defective item tends to be produced due to a resin leakage from a gap formed between the wiring board 1 and the mold.

Figure 5A:
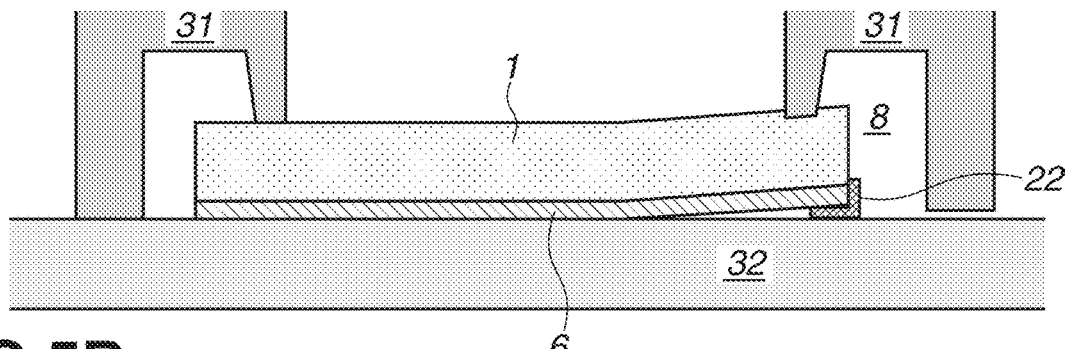
FIGS. 5A, 5B, 5C, and 5D are diagrams each illustrating a mounting unit.

FIG. 5A illustrates a state where the wiring board 1 is clamped between the upper mold 31 for molding and the lower mold 32 for molding in order to form the resin member 8 as the frame to the wiring board 1. The solid body 22 adhering to the end face 3 of the wiring board 1 is caught between the undersurface of the wiring board 1 and the lower mold 32 so that the wiring board 1 is disposed in a warped state. In this state, resin molding is performed by injecting a resin between the upper mold 31 and the lower mold 32 to from the resin member 8. Afterward, a molded product is taken out from between the upper mold 31 and the lower mold 32.

The leakage of the molding resin to the undersurface of the wiring board 1 can occur due to the solid body 22 being caught between the lower mold 32 and the wiring board 1. In addition, the wiring board 1 is molded in a warped state due to the foreign substance being caught therebetween, and therefore it is apparent that there is a defect in terms of flatness. The first to third exemplary embodiments described above can each provide a structure for preventing the resin leakage and not impairing the flatness even if the solid body 22 is present as the foreign substance.

Figure 5B:
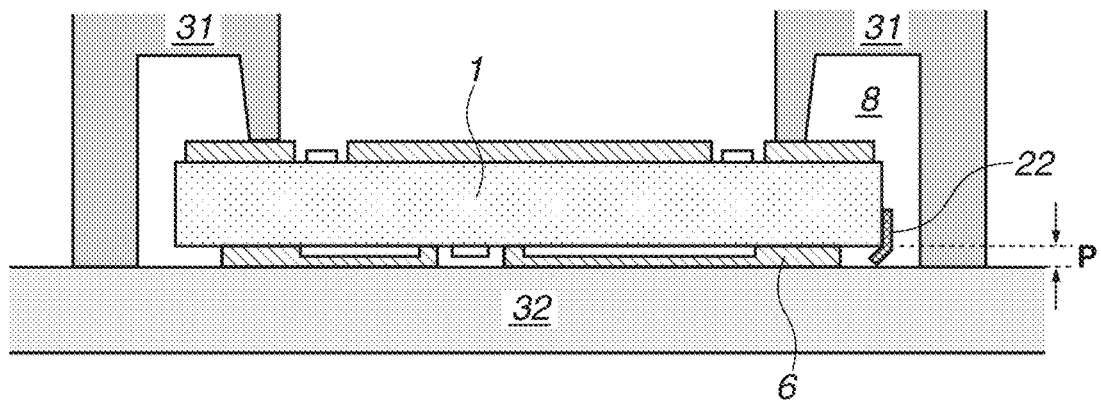

In FIG. 5B, as described above, the edge 12 of the insulating film 6 provided on the undersurface 5 of the wiring board 1 is provided away from the end 13 of the wiring board 1. In other words, the edge 12 of the insulating film 6 is formed inside of the end 13 of the wiring board 1 in a direction along the undersurface 5 of the wiring board 1. Further, since the insulating film 6 is thick, a gap P attributable to a step corresponding to the thickness of the insulating film 6 is formed in the thickness direction between the undersurface 5 of the wiring board 1 and a surface of the insulating film 6. Furthermore, with regard to the insulating film 6, the offset region 50 and the non-overlap region 51 each extending over a predetermined distance from the end 13 of the wiring board 1 to inside of the end 13 of the wiring board 1 are regions where the conductive layer 7 is not disposed. In a case where the insulating film 6 and the conductive layer 7 are disposed in a region extending over the predetermined distance from the end 13 of the wiring board 1, the surface of the insulating film 6 undulates between a portion where the conductive layer 7 is present and a portion where the conductive layer 7 is not present, so that irregularities are formed. If such an undulating portion is clamped between the upper mold 31 and the lower mold 32 when the resin member 8 is molded, a gap can be formed between the lower mold 32 and the insulating film 6, and the gap may cause a resin leakage. Thus, occurrence of the resin leakage can be prevented by providing the offset region 50 and the non-overlap region 51 on the undersurface 5 side at a position to be held and pressurized by the upper mold 31, and by pressurizing a region overlapping the offset region 50 and the non-overlap region 51 on the surface 4 side.

FIG. 5B illustrates a state where the wiring board 1 is clamped between the upper mold 31 for molding and the lower mold 32 for molding in order to form the resin member 8 to the wiring board 1 according to the first exemplary embodiment. The solid body 22 in fibrous form hangs from the end face 3 of the wiring board 1 formed by using a flat mold and curves toward the undersurface 5 of the wiring board 1.

As compared with FIG. 5A, since an edge 12 of the insulating film 6 recedes and the lower mold 32 has a flat surface, the gap P is formed between the undersurface 5 and the flat surface of the lower mold 32. Although the lower mold 32 can be fabricated so as to have a shape matching a receding shape of the edge 12 of the insulating film 6, the gap P is not formed in such a case. Thus, it is necessary that the edge 12 of the insulating film 6 recedes and the shape of the lower mold 32 be devised so that a space is formed in the receding portion. In a case where the gap P is formed, even if the solid body 22 adhering to the end face 3 of the wiring board 1 curves toward the undersurface 5 of the wiring board 1, the solid body 22 can be contained in the space of the gap P. Thus, it is possible to prevent the foreign substance from being caught between the wiring board 1 and the lower mold 32. In addition, as a result, the wiring board 1 is held flat on the lower mold 32.

Furthermore, since the solid body 22 is contained in the gap P and is not caught in the lower mold 32, it is possible to perform molding without having a leakage of the molding resin. In addition, it is apparent that the flatness of the wiring board 1 is maintained after molding. Moreover, the surface of the insulating film 6 and the lower surface 85 of the resin member 8 can be formed to be flush with each other, whereby a module superior in terms of undersurface flatness can be provided.

As illustrated in FIG. 1A, the module produced in this way is in a state where the resin member 8 is in contact with a portion between the edge 12 of the insulating film 6 and the end 13 of the wiring board 1 (offset region 50) of the undersurface 5. In this state, the gap P is filled with the resin member 8. If the resin member 8 is a molding resin and a molding method is used, the gap P can be easily filled with the resin. In addition, if the molding method is used, a foreign substance extending from a board end can also be embedded in the resin at the same time. Thus, these will not be the foreign substance sources after filling of the resin.

Further, as illustrated in FIG. 1B, it is desirable that the edge 11 of the conductive layer 7 be not exposed from the insulating film 6. If the conductive layer 7 is exposed, a spatial region indicated as the gap P becomes small, and the ability to contain the solid body 22 of the end face 3 of the wiring board 1 decreases.

As described above, a module structure according to the present exemplary embodiment makes it possible to provide a module including the wiring board 1 that is flat, preventing occurrence of a defect such as a resin leakage, and having a stable shape.

Figure 5C:
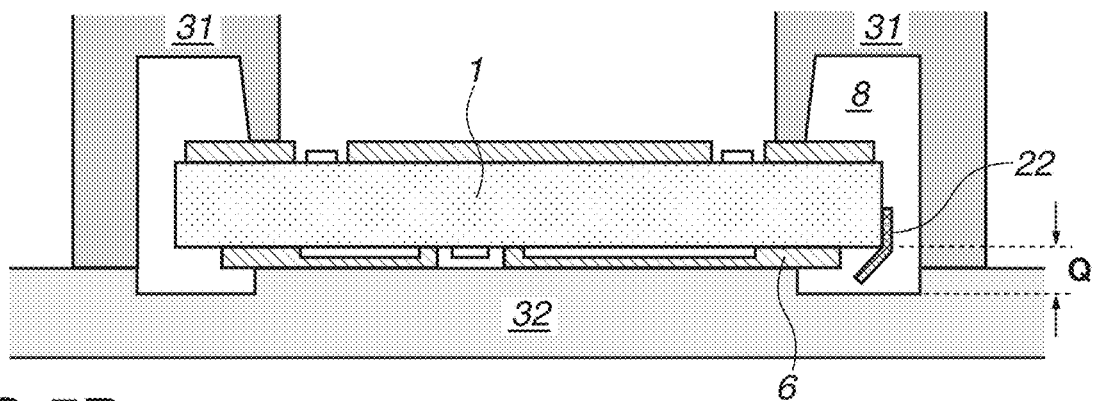

FIG. 5C illustrates a state where the wiring board 1 is clamped between the upper mold 31 for molding and the lower mold 32 for molding to form the resin member 8 to the wiring board 1.

FIG. 5C illustrates a state where the wiring board 1 is clamped between the upper mold 31 for molding and the lower mold 32 for molding and molding is performed to form a frame member to the wiring board 1 according to the second exemplary embodiment. The solid body 22 is the foreign substance, and this foreign substance is illustrated as a foreign substance that is larger and longer than that in the first exemplary embodiment. Even if the foreign substance at the end face 3 of the wiring board 1 curves toward the undersurface of the wiring board 1, the foreign substance can be contained in a gap Q. Thus, it is possible to prevent the foreign substance from being caught between the wiring board 1 and the lower mold 32. In addition, since the gap Q has a volume larger than a volume of the gap P in FIG. 5B of the first exemplary embodiment, a larger foreign substance can be contained as the foreign substance at the end face 3 of the wiring board 1. As a result, a risk of the foreign substance being caught by the lower mold 32 can be reduced, and thus the yield can be improved. Since a larger foreign substance can be contained in the gap Q, a possibility of the foreign substance being caught between the wiring board 1 and the lower mold 32 can be further reduced. Accordingly, the wiring board 1 is held flat on the lower mold 32. This can reduce a rejection rate.

Figure 5D:
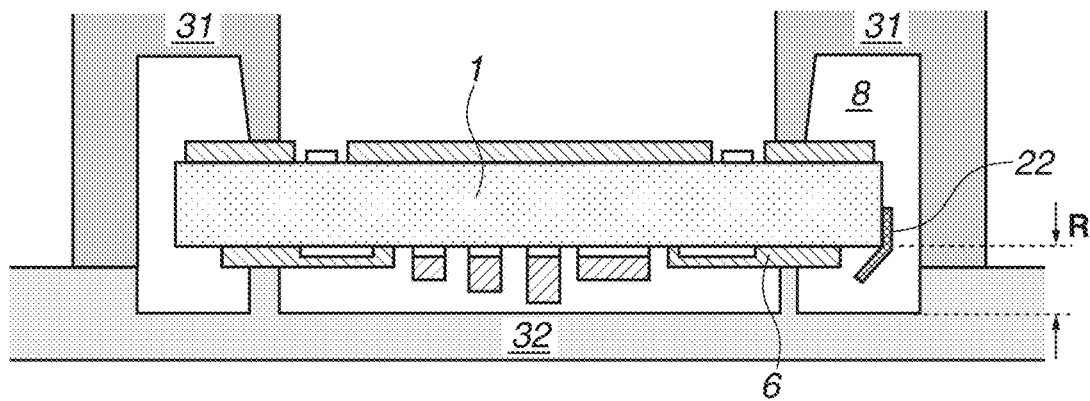

FIG. 5D illustrates a state where the wiring board 1 is clamped between the upper mold 31 for molding and the lower mold 32 for molding and resin molding is performed to form the resin member 8 to the wiring board 1 according to the third exemplary embodiment. The molding is performed in a state where the electronic components 16 are arranged as illustrated in FIG. 5D. The lower mold 32 has a recessed portion corresponding to the electronic components 16 so that the lower mold 32 is provided away from the electronic components 16. The molding resin is not injected into a clearance formed between the lower mold 32 and the electronic components 16.

Figure 6A:
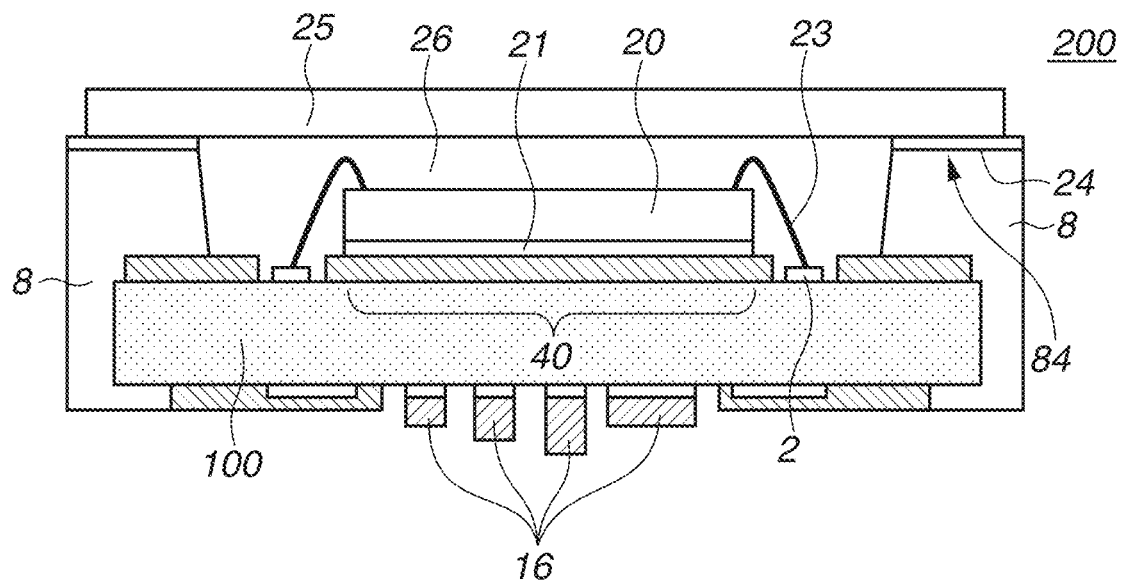
FIGS. 6A and 6B are diagrams each illustrating an electronic module.

FIG. 6A is a cross-sectional diagram schematically illustrating an electronic module 200 according to a fourth exemplary embodiment. The electronic module 200 includes the mounting unit 100 described above, and the electronic device 20 mounted on the mounting portion 40 of the mounting unit 100. The mounting unit 100 according to the fourth exemplary embodiment has the characteristics of the mounting unit 100 of each of the first exemplary embodiment and the third exemplary embodiment, but it may also have the characteristics of the mounting unit 100 of another exemplary embodiment. However, in the present exemplary embodiment, the thickness T5 is smaller than the heights of the electronic components 16.

The electronic device 20 is electrically connected to the mounting unit 100 (wiring board 1) via a conductive member. The electronic device 20 is fixed to the mounting portion 40 of the wiring board 1 by an adhesive 21 such as a die bonding paste. Further, the electronic module 200 includes a bonding wire 23 as a conductive member that electrically connects the electronic device 20 to the wiring board 1. Solder can be used as the conductive member in place of the bonding wire 23. The electronic device 20 is electrically connected to the conductive layer 2 of the wiring board 1 by the bonding wire 23.

The electronic module 200 includes a facing member 25 facing the electronic device 20. The facing member 25 has a role in protecting the electronic device 20 from damage and contamination. The facing member 25 is fixed to the resin member 8. More specifically, the facing member 25 is bonded to the resin member 8 with an adhesive 24 provided between the facing member 25 and the upper surface 84 of the resin member 8.

The electronic device 20 can be a device that uses light (optical device). The electronic device 20 serving as the optical device can be an image pickup device such as a complementary metal oxide semiconductor (CMOS) image sensor or a charge-coupled device (CCD) image sensor, or a display device such as a liquid crystal display or an electroluminescence (EL) display. The electronic device 20 can also be another type of optical device such as an autofocus (AF) sensor or an autoexposure (AE) sensor. In a case where the electronic device 20 is the optical device, it is desirable that the facing member 25 be a light transmitting member made of a material such as glass, plastic, or crystal so that the facing member 25 does not block light to the electronic device 20. The facing member 25 may be an optical member such as a lens or a filter. Since the facing member 25 is disposed, the electronic module 200 has a hollow structure in which an inner space 26 between the electronic device 20 and the facing member 25 is substantially cut off from outside air. The inner space 26 is filled with gas such as air or nitrogen.

The electronic module 200 according to the present exemplary embodiment can be fabricated with a high yield by using the mounting unit 100 in which the influence of the foreign substance is reduced as described above. In addition, in a case where the electronic device 20 is the image pickup device or the display device, since the influence of the foreign substance is reduced, deterioration in image quality due to the foreign substance does not occur and the image quality can be improved. In addition, the mounting unit 100 can be improved in terms of flatness, and the electronic module 200 having a stable shape can be provided.

Since the resin member 8 is used to protect the electronic device 20 and support the facing member 25, a reduction in weight of the electronic module 200 can be achieved. The plurality of electronic components 16 described above is mounted on the undersurface 5, whereby it is not necessary to mount the plurality of electronic components 16 on another substrate. This makes it unnecessary to provide the other substrate on which the plurality of electronic components 16 is to be mounted. Accordingly, the weight of the electronic module 200 can be reduced.

Figure 6B:
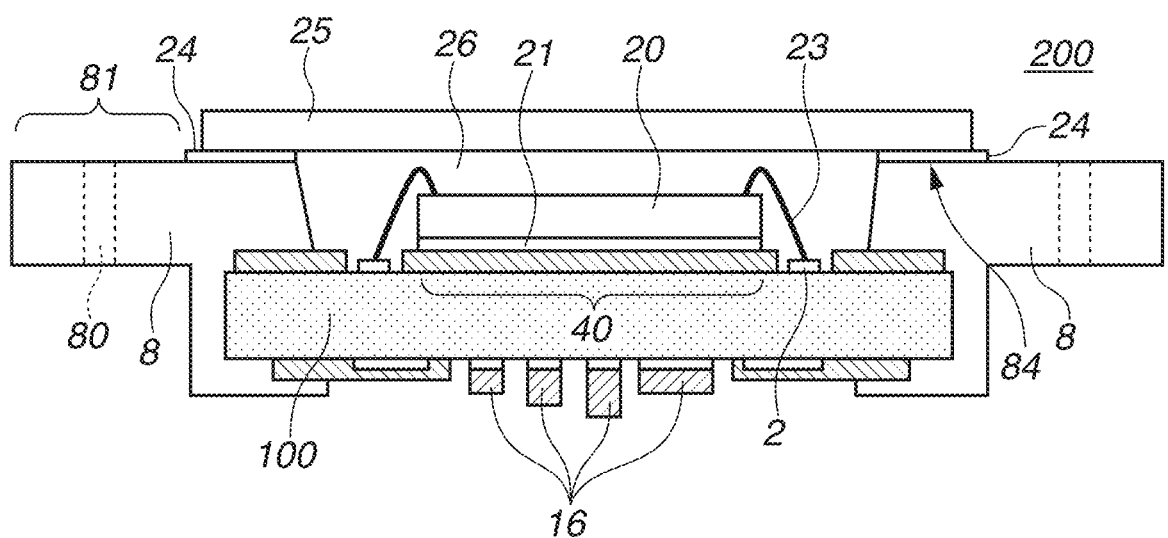

FIG. 6B is a cross-sectional diagram schematically illustrating an electronic module 200 according to a fifth exemplary embodiment. In the fifth exemplary embodiment, a point that can be the same as that of the fourth exemplary embodiment will not be described.

The resin member 8 of the mounting unit 100 used in the electronic module 200 according to the fifth exemplary embodiment has an expansion portion 81 extending from the wiring board 1 in a direction along the surface 4. The expansion portion 81 of the resin member 8 of the mounting unit 100 does not overlap the wiring board 1 in a direction perpendicular to the surface 4. Further, the expansion portion 81 in the electronic module 200 does not overlap the facing member 25 in the direction perpendicular to the surface 4. The expansion portion 81 is provided with a through hole 80. The mounting unit 100 and the electronic module 200 can be fixed by disposing a pin for positioning or a screw for fixing inside the through hole 80.

Figure 7:
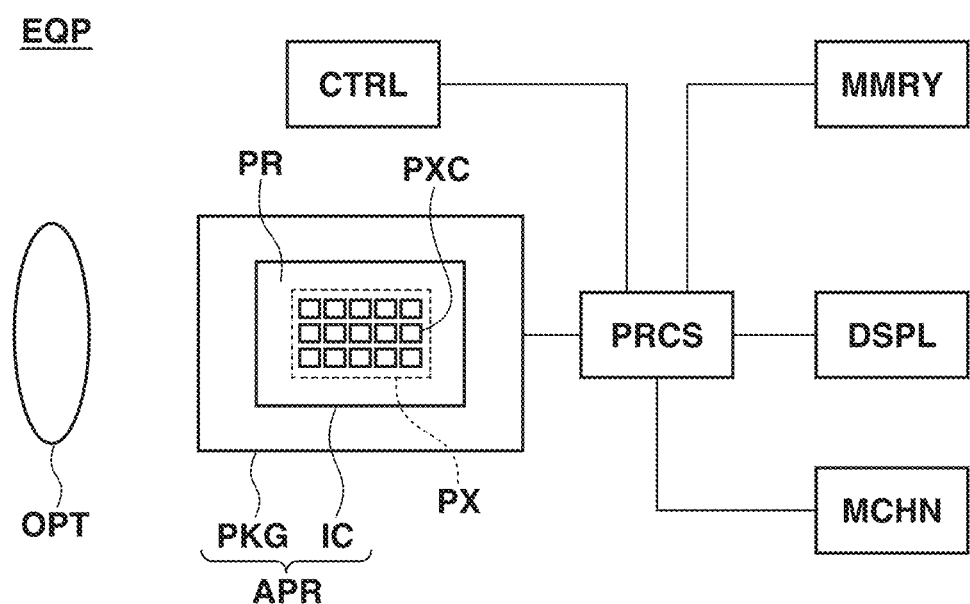
FIG. 7 is a block diagram illustrating equipment.

FIG. 7 is a diagram schematically illustrating equipment EQP according to a sixth exemplary embodiment. FIG. 7 schematically illustrates the equipment EQP including an electronic module APR. The electronic module APR includes an electronic device IC and a package PKG. The electronic module 200 according to each of the above-described exemplary embodiments is applicable to the electronic module APR, and the electronic device 20 according to each of the above-described exemplary embodiments is applicable to the electronic device IC. The package PKG corresponds to the configuration inside the electronic module 200 except for the electronic device 20. The mounting unit 100 according to each of the above-described exemplary embodiments and the facing member 25 of the electronic module 200 according to each of the above-described exemplary embodiments are applicable to the package PKG.

The electronic module APR of this example can be used as, for example, an image sensor, an AF sensor, an AE sensor, or a ranging sensor. In the equipment EQP, the electronic device 20 has a pixel area PX in which pixel circuits PXC are arranged in a matrix. The electronic device IC can have a peripheral area PR around the pixel area PX. A circuit other than the pixel circuits PXC can also be disposed in the peripheral area PR.

The equipment EQP can further include at least one of an optical system OPT, a control device CTRL, a processing device PRCS, a display device DSPL, a memory device MMRY, and a machine device MCHN. The equipment EQP will be described in detail below.

The equipment EQP illustrated in FIG. 7 will be described in detail. The electronic device 20 may have a structure (chip lamination structure) in which a first semiconductor chip provided with a plurality of pixel circuits and a second semiconductor chip provided with a peripheral circuit are laminated. The peripheral circuit in the second semiconductor chip can be a column circuit corresponding to each pixel column of the first semiconductor chip. The peripheral circuit in the second semiconductor chip can also be a matrix circuit corresponding to each pixel or each pixel block of the first semiconductor chip. For connection between the first semiconductor chip and the second semiconductor chip, it is possible to use connection by a through silicon via (TSV), connection by inter-chip wiring using direct connection of conductive bodies such as copper, connection between chips by microbumps, or connection by wire bonding.

The equipment EQP can further include at least one of the optical system OPT, the control device CTRL, the processing device PRCS, the display device DSPL, and the memory device MMRY. The optical system OPT is associated with the electronic module APR, and includes a lens for forming an image on the electronic device IC, a shutter located on an optical path to the electronic device IC, and a mirror. The control device CTRL controls the electronic module APR, and is, for example, a semiconductor device such as an application specific integrated circuit (ASIC). The processing device PRCS processes a signal output from the electronic module APR, and constitutes an analog front end (AFE) or a digital front end (DFE). The processing device PRCS is a semiconductor device such as a central processing unit (CPU) or an ASIC. The display device DSPL is an electro luminescent (EL) display or a liquid crystal display that displays information (image) obtained by the electronic module APR. The memory device MMRY is a magnetic device or a semiconductor device that stores the information (image) obtained by the electronic module APR. The memory device MMRY is a volatile memory such as a static random access memory (SRAM) or a dynamic RAM (DRAM), or a nonvolatile memory such as a flash memory or a hard disk drive. The machine device MCHN has a moving unit or a driving unit such as a motor or an engine. In the equipment EQP, a signal output from the electronic module APR is displayed on the display device DSPL, or transmitted to outside by a communication device (not illustrated) included in the equipment EQP. Thus, it is desirable that the equipment EQP further include the memory device MMRY and the processing device PRCS separately from a memory circuit unit and an operation circuit unit included in the electronic module APR.

The equipment EQP illustrated in FIG. 7 can be electronic equipment such as an information terminal (e.g., a smartphone or a wearable terminal) or a camera (e.g., a lens interchangeable camera, a compact camera, a video camera, or a monitoring camera) having an image capturing function. The machine device MCHN in the camera can drive a component of the optical system OPT to perform zooming, focusing, and shutter operation. The equipment EQP can also be transport equipment (moving body) such as a vehicle, a ship, or a flight vehicle. The equipment EQP can also be medical equipment such as an endoscope or a computerized tomography (CT) scanner.

The machine device MCHN in the transport equipment can be used as a moving device. The equipment EQP serving as the transport equipment is desirable for equipment that transports the electronic module APR and equipment that assists and/or automates driving (steering) using an image capturing function. The processing device PRCS for assisting and/or automating the driving (steering) can perform processing for operating the machine device MCHN serving as the moving device based on the information obtained by the electronic module APR. In particular, the machine device MCHN can move (displace) the electronic module APR in the equipment EQP. For example, in the camera, a camera-shake prevention (image stabilization) function can be achieved by displacing the electronic module APR using the machine device MCHN. Since the weight of the electronic module APR according to the present exemplary embodiment is reduced, it is possible to achieve a higher moving speed and a load reduction of the machine device MCHN for the displacement. Since measures against the foreign substance are improved, the electronic module APR according to the present exemplary embodiment can reduce an undesirable influence by the foreign substance even if the electronic module APR is displaced.

The electronic module APR according to the present exemplary embodiment can provide a high value to a designer, a manufacturer, a seller, a buyer, and/or a user. Thus, if the electronic module APR is mounted on the equipment EQP, the value of the equipment EQP can also be increased. Thus, in manufacturing and selling the equipment EQP, determining to mount the electronic module APR according to the present exemplary embodiment on the equipment EQP is advantageous in terms of increasing the value of the equipment EQP.

The above-described exemplary embodiments can be appropriately modified within a range not departing from the idea of the present technique.

While the present disclosure has been described with reference to exemplary embodiments, it is to be understood that the disclosure is not limited to the disclosed exemplary embodiments. The scope of the following claims is to be accorded the broadest interpretation so as to encompass all such modifications and equivalent structures and functions.

This application claims the benefit of Japanese Patent Application No. 2018-161962, filed Aug. 30, 2018, which is hereby incorporated by reference herein in its entirety.

What is claimed is:

1. A unit comprising:
a wiring board having a first face having a mounting portion on which an electronic device is mounted, a second face opposite to the first face, and end faces continuous with the first face and the second face;
a resin member provided to cover the end faces and to have portions between which a space above the mounting portion is located; and
an insulating film covering the second face,
wherein at least a part of an edge of the insulating film is provided away from an end of the second face on the end face side,
wherein the wiring board includes a substrate, and a conductive layer provided on the substrate,
wherein a face of the substrate and the conductive layer constitute the second face, and
wherein a thickness of the insulating film is larger than a thickness of the conductive layer.

2. The unit according to claim 1, wherein the resin member covers a region of the second face between the part of the edge of the insulating film and the end of the second face.

3. The unit according to claim 2, wherein a difference between a thickness of the resin member on the region and a thickness of the insulating film is smaller than the thickness of the insulating film.

4. The unit according to claim 2, wherein a difference between a thickness of the resin member on the region and a thickness of the insulating film is greater than the thickness of the insulating film.

5. The unit according to claim 1, wherein a portion of the insulating film is located between the resin member and the second face.

6. A unit comprising:
a wiring board having a first face having a mounting portion on which an electronic device is mounted, a second face opposite to the first face, and end faces continuous with the first face and the second face;
a resin member provided to cover the end faces and to have portions between which a space above the mounting portion is located; and
at least one electronic component disposed on the second face and fixed to the wiring board,
wherein, when viewed in a direction perpendicular to the second face, the resin member does not overlap the one electronic component,
wherein the wiring board includes a substrate, and a conductive layer provided on the substrate,
wherein a face of the substrate and the conductive layer constitute the second face, and
wherein a thickness of the insulating film is larger than a thickness of the conductive layer.

7. The unit according to claim 6, wherein the one electronic component overlaps the mounting portion when viewed in the direction perpendicular to the second face.

8. The unit according to claim 6,
wherein the resin member has a portion covering the second face, the portion not overlapping the electronic component, and
wherein the resin member is provided to have portions between which the one electronic component is arranged.

9. The unit according to claim 1,
wherein the resin member is provided away from the conductive layer.

10. The unit according to claim 1,
wherein, when viewed in a direction perpendicular to the second face, the resin member does not overlap the conductive layer.

11. The unit according to claim 1, wherein a thickness of a portion of the resin member located on the first face is greater than a thickness of a portion of the resin member located on the second face.

12. The unit according to claim 1, wherein the resin member is provided to surround the space.

13. The unit according to claim 1,
wherein the wiring board includes a glass epoxy substrate, and
wherein the resin member is a molded member.

14. The unit according to claim 1, wherein a solid body made of a same material as a material of the wiring board is embedded in the resin member.

15. A module comprising:
an electronic device;
a wiring board having a first face having a mounting portion on which the electronic device is mounted, a second face opposite to the first face, and end faces continuous with the first face and the second face;
a resin member provided to cover the end faces and to have portions between which a space above the mounting portion is located; and
at least one electronic component disposed on the second face and fixed to the wiring board,
wherein, when viewed in a direction perpendicular to the second face, the resin member does not overlap the one electronic component,
wherein the wiring board includes a substrate, and a conductive layer provided on the substrate,
wherein a face of the substrate and the conductive layer constitute the second face, and
wherein a thickness of the insulating film is larger than a thickness of the conductive layer.

16. The module according to claim 15, further comprising: a bonding wire configured to electrically connect the electronic device to the wiring board.

17. The module according to claim 15, further comprising: a facing member facing the electronic device,
wherein the facing member is fixed to the resin member.

18. The module according to claim 15, wherein the electronic device is an image pickup device or a display device.

19. Equipment comprising:
the module according to claim 15; and
at least one of
an optical system associated with the electronic device,
a control unit configured to control the electronic device,
a processing unit configured to process a signal output from the electronic device,
a display unit configured to display information obtained by the electronic device, and
a memory unit configured to store information obtained by the electronic device.

20. Equipment comprising:
the module according to claim 15; and
a machine device configured to move the module.

* * * * *